United States Patent
Hien et al.

(10) Patent No.: US 11,462,500 B2
(45) Date of Patent: Oct. 4, 2022

(54) OPTOELECTRONIC SEMICONDUCTOR DEVICE AND METHOD FOR PRODUCING OPTOELECTRONIC SEMICONDUCTOR DEVICES

(71) Applicant: OSRAM OLED GmbH, Regensburg (DE)

(72) Inventors: Matthias Hien, Kirchroth (DE); Matthias Goldbach, Pentling (DE); Michael Zitzlsperger, Regensburg (DE); Ludwig Peyker, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 127 days.

(21) Appl. No.: 16/962,175

(22) PCT Filed: Jan. 23, 2019

(86) PCT No.: PCT/EP2019/051608
§ 371 (c)(1),
(2) Date: Jul. 14, 2020

(87) PCT Pub. No.: WO2019/145350
PCT Pub. Date: Aug. 1, 2019

(65) Prior Publication Data
US 2020/0402943 A1    Dec. 24, 2020

(30) Foreign Application Priority Data
Jan. 26, 2018 (DE) .......................... 102018101813.4

(51) Int. Cl.
*H01L 23/00* (2006.01)
*H01L 25/04* (2014.01)
(Continued)

(52) U.S. Cl.
CPC .............. *H01L 24/24* (2013.01); *H01L 24/25* (2013.01); *H01L 25/042* (2013.01);
(Continued)

(58) Field of Classification Search
CPC ......... H01L 33/62; H01L 33/52; H01L 33/60; H01L 31/02005; H01L 31/0203;
(Continued)

(56) References Cited

U.S. PATENT DOCUMENTS 8,461,601 B2   6/2013   Herrmann
8,742,448 B2   6/2014   Ramchen et al.
(Continued)

FOREIGN PATENT DOCUMENTS

DE   102007030129 A1   1/2009
DE   102009015963 A1   10/2010
(Continued)

*Primary Examiner* — Feifei Yeung Lopez
(74) *Attorney, Agent, or Firm* — Slater Matsil, LLP

(57) ABSTRACT

In one embodiment, an optoelectronic semiconductor device includes at least two lead frame parts and an optoelectronic semiconductor chip which is mounted in a mounting region on one of the lead frame parts. The lead frame parts are mechanically connected to one another via a casting body. The semiconductor chip is embedded in the cast body. In the mounting region the respective lead frame part has a reduced thickness. An electrical line is led over the cast body from the semiconductor chip to a connection region of the other of the lead frame parts. In the connection region, the respective lead frame part has the full thickness. From the connection region to the semiconductor chip the electrical line does not overcome any significant difference in height.

18 Claims, 14 Drawing Sheets

(51) Int. Cl.
*H01L 25/075* (2006.01)
*H01L 25/16* (2006.01)
*H01L 31/02* (2006.01)
*H01L 33/62* (2010.01)
*H01L 31/0203* (2014.01)
*H01L 33/52* (2010.01)
*H01L 33/60* (2010.01)

(52) U.S. Cl.
CPC ........ *H01L 25/0753* (2013.01); *H01L 25/167* (2013.01); *H01L 31/02005* (2013.01); *H01L 33/62* (2013.01); *H01L 31/0203* (2013.01); *H01L 33/52* (2013.01); *H01L 33/60* (2013.01); *H01L 2224/24137* (2013.01); *H01L 2224/24175* (2013.01); *H01L 2924/12041* (2013.01); *H01L 2924/12043* (2013.01); *H01L 2933/005* (2013.01); *H01L 2933/0066* (2013.01)

(58) Field of Classification Search
CPC . H01L 25/042; H01L 25/0753; H01L 25/167; H01L 24/24; H01L 24/25
See application file for complete search history.

(56) References Cited

U.S. PATENT DOCUMENTS

| | | | |
|---|---|---|---|
| 9,142,739 | B2 | 9/2015 | Eder et al. |
| 2002/0001869 | A1* | 1/2002 | Fjelstad .............. H01L 31/0203 438/48 |
| 2005/0280017 | A1 | 12/2005 | Oshio et al. |
| 2010/0187546 | A1 | 7/2010 | Fushimi et al. |
| 2012/0132938 | A1* | 5/2012 | Komatsu ............... H01L 25/167 257/89 |
| 2013/0170208 | A1* | 7/2013 | Kuwaharada .......... F21V 13/04 362/243 |
| 2013/0343067 | A1 | 12/2013 | Okada |
| 2014/0117388 | A1 | 5/2014 | Kuo et al. |
| 2015/0076549 | A1* | 3/2015 | Gebuhr ................... H01L 33/62 257/99 |
| 2015/0207050 | A1* | 7/2015 | Tsukada ................. H01L 24/82 257/784 |
| 2017/0162520 | A1 | 6/2017 | Kaneko et al. |

FOREIGN PATENT DOCUMENTS

DE 102011053360 A1 3/2012
EP 2081238 A1 7/2009

* cited by examiner

OPTOELECTRONIC SEMICONDUCTOR DEVICE AND METHOD FOR PRODUCING OPTOELECTRONIC SEMICONDUCTOR DEVICES

This patent application is a national phase filing under section 371 of PCT/EP2019/051608, filed Jan. 23, 2019, which claims the priority of German patent application 102018101813.4, filed Jan. 26, 2018, each of which is incorporated herein by reference in its entirety.

TECHNICAL FIELD

An optoelectronic semiconductor device is specified. In addition, a method for producing optoelectronic semiconductor devices is specified.

SUMMARY

Embodiments provide an optoelectronic semiconductor device in which semiconductor chips are efficiently electrically contacted.

According to at least one embodiment, the semiconductor device comprises two or more than two lead frame parts. The lead frame parts together form a lead frame of the semiconductor device. Preferably, the lead frame parts are made of the same pre-product. The pre-product is in particular a metal sheet like a copper sheet. Thus the lead frame parts are metallic components of the semiconductor device which are electrically conductive.

According to at least one embodiment, the semiconductor device comprises one or more optoelectronic semiconductor chips. The at least one semiconductor chip is mounted in a mounting region on one of the lead frame parts. If there are several semiconductor chips, they may be mounted on a single lead frame part or on several lead frame parts, individually or in groups.

The at least one semiconductor chip is preferably a light emitting diode chip, or LED chip for short. Alternatively, the semiconductor chip can be a detector chip, such as a photodiode or a CCD field. In the case of several semiconductor chips, radiation-emitting semiconductor chips can also be combined with radiation-detecting semiconductor chips.

According to at least one embodiment, the semiconductor device comprises a cast body. The cast body mechanically connects the lead frame parts with each other. This means that without the cast body the semiconductor device would not be mechanically stable.

According to at least one embodiment, the at least one semiconductor chip is embedded in the cast body. This means in particular that side surfaces of the semiconductor chip are completely or predominantly covered by the cast body and that the cast body is positively and/or directly connected to the semiconductor chip. Preferably, the cast body surrounds the semiconductor chip in a closed path in plan view.

According to at least one embodiment, the semiconductor device comprises one or more electrical lines. The at least one electrical line is configured for electrical contacting of the at least one semiconductor chip. Preferably, the electrical line is a metallic line, for example as main components comprising copper, aluminium, gold and/or silver.

According to at least one embodiment, the semiconductor chip comprises a chip top side. The chip top side is facing away from the mounting region and can be oriented parallel to the mounting region. Preferably, the chip top side is a radiation main side of the semiconductor chip. This means that all or a predominant part of the radiation generated in the semiconductor chip escapes via the chip top side if the semiconductor chip is a radiation-emitting semiconductor chip. Otherwise, the chip to side is a radiation entry surface or detection side, in the case of a detector chip for the semiconductor chip.

According to at least one embodiment, the lead frame part on which the semiconductor chip is arranged has a reduced thickness in the mounting region. This means that the mounting region is thinner than at least one other region of the lead frame parts.

According to at least one embodiment, the electrical line is led across the cast body from the semiconductor chip to a connection region of another of the lead frame parts. An electrical connection between the semiconductor chip and the further lead frame part is realized via the electrical line. Thus the semiconductor chip is electrically connected via at least two of the lead frame parts. The electrical line is preferably located directly on the cast body, especially along the entire path that the electrical line travels on the cast body.

According to at least one embodiment, the lead frame part with the connection region has the full thickness, especially in the connection region. In other words, there is no reduction in the thickness of the lead frame parts in the connection region. It is possible that the full thickness is only present in at least one connection region.

The connection region may be the thickest area of the lead frame parts. In particular, there is no thinning in the connection region from an emission side of the semiconductor device. On the other hand, there may in principle be a reduction in thickness from a bottom side which is opposite the mounting region of the lead frame part with the semiconductor chip; however, this is less preferred.

According to at least one embodiment, the electrical line does not overcome a significant difference in height from the connection region to the semiconductor chip. This means in particular that in a direction perpendicular to the mounting region, especially on a top side of the cast body, the height difference is at most 50 µm or 30 µm or 20 µm or 10 µm or 5 µm or that there is no height difference. This preferably means that the chip top side and the connection region are in the same plane or are approximately in the same plane. This plane is preferably oriented parallel to the mounting region. This height difference is preferably not exceeded along the entire path covered by the electrical line. This means that a maximum height difference overcome by the electrical line is below the values mentioned above.

In at least one embodiment, the optoelectronic semiconductor device comprises at least two lead frame parts and at least one optoelectronic semiconductor chip mounted in a mounting region on one of the lead frame parts. The lead frame parts are mechanically connected to each other by means of a cast body. The semiconductor chip is embedded in the cast body. The semiconductor chip has a chip top side facing away from the mounting region. In the mounting region the respective lead frame part has a reduced thickness. At least one electrical line is led across the cast body from the semiconductor chip to a connection region of another of the lead frame parts. In this connection region, the respective lead frame part has the full thickness, at least when viewed from an emission side. From the connection region to the semiconductor chip, the lead overcomes a height difference of at most 20 µm in the direction perpendicular to the mounting region.

For contacting semiconductor chips, such as light emitting diode chips or silicon detectors, a planar electrical connection, also called planar interconnect, is often used. This usually requires a relatively long or deep electrical through-connection, also known as a via contact, to get from the level of the chip top side to the surface of a substrate such as a printed circuit board, a ceramic carrier or a lead frame. These vias are complex to produce and relatively sensitive.

With the semiconductor device described here, such vias can be avoided or at least their height can be significantly reduced. This is achieved in particular by placing the semiconductor chip in an etch-back of one of the lead frame parts, which preferably corresponds to a chip height. Electrical contact surfaces of the semiconductor chip are thus practically in the same plane as an upper side of the lead frame solid material. After encapsulating or overmolding the semiconductor chips and the lead frame parts, in particular by film-assisted spraying, also known as film assisted molding, planar contacts in the form of the electrical leads can be created practically without vias.

Due to the tolerances of the chip height and the back etching of the lead frame, not all surfaces are usually at the same level. Therefore, when creating the cast body, trenches and dents occur in the top surface of the cast body and/or the semiconductor devices. In a planar interconnect this can lead to short circuits between the top side and the side surfaces of the semiconductor chips or the associated lead frame part. This can be avoided or at least mitigated by placing the semiconductor chips lower than or at the same height as a top surface of the lead frame.

Deep vias can be avoided by placing the chip top sides and the lead frame contacts for the electrical lines at almost the same height. The complex production of the vias with, for example, the creation of drill holes and the coating of via walls is no longer necessary. This also reduces or avoids weak points for cracks on the traces and on the edges of the vias, especially in case of thermal stress.

Furthermore, already after the creation of the cast body and before the processing of the planar interconnects, both the semiconductor chips and the lead frame parts can be contacted from above, e.g., with test needles. This allows a functional test to be carried out even before the components are separated. Defective components can be removed from the process before further steps such as the application of phosphors.

If several semiconductor chips are interconnected by planar interconnects to form a module, the circuit can be adapted if necessary by prior testing, for example by bypassing defective semiconductor chips in a laser lithography step instead of creating a short circuit or open contacts. This allows the yield during production to be increased.

In addition, designs of the semiconductor devices are made possible in which any large areas of the lead frame parts can be exposed on the top side of a device. In addition to electrical contacting, these areas can also be used to apply markings, such as individual component codes, customer-specific markings, brightness groupings and/or color location groupings, by means of laser writing.

In particular, the application of test data is possible. Since the devices can still be tested in combination, both the testing and the writing of the devices with, for example, a brightness grouping or a color location grouping is less complex than after separation. This opens up the possibility to save final testing after separation. In particular, the devices are marked in machine-readable form in accordance with the respective grouping in color location and/or brightness, whereby a final measurement can optionally be carried out subsequently.

Markings such as DMC codes or OCR codes are possible in metal to a much smaller extent than in casting materials such as epoxies or silicones. Due to the higher contrast, such markings in metal are also easier to read. Since the surface of the lead frame is exposed at the corresponding points throughout the entire process chain, a code can be applied at the very beginning, so that the device can be tracked throughout the entire process chain. An NMF code and individual component markings can be applied in the same step. Separate writing of the individual markings is not necessary.

Furthermore, one top side of the device composite and the device is essentially flat. A fluorescent material can therefore be applied to the semiconductor chips for wavelength conversion, for example in the form of a glued-on platelet, by means of an exposure technique or by spraying. Optical elements such as Fresnel optics or lenses can also be attached to the chip top side, for example by gluing, spraying or printing.

The lead frame can also be used as a reflector, in particular by placing the semiconductor chip in an etch-back and/or using a transparent material for the cast body. A short-circuit of the electrical lines on the walls of the reflector can be avoided by etching back the reflector at the appropriate point or by routing the planar interconnect, i.e., the electrical line, through electrical insulation.

According to at least one embodiment, the connection region is higher than the chip top side. In particular, height refers to a distance from a bottom side of the semiconductor device. On the bottom side, the semiconductor device may be mounted, especially via surface mounting, SMT for short.

According to at least one embodiment, the mounting region lays in a trough of respective the semiconductor. The trough preferably forms a reflector for radiation generated during operation.

According to at least one embodiment, a wall of the respective semiconductor device is formed around the trough. The wall preferably has a recess in the area of the electrical line. The recess increases the distance between the electrical line and the respective semiconductor device due to the recess. As an alternative to a recess, an electrical insulation layer can also be present on the wall or at the wall.

According to at least one embodiment, a fluorescent body is arranged to the chip top side. The fluorescent body is, for example, a ceramic or a silicon plate. The fluorescent body comprises one or more phosphors. The at least one phosphor is configured to partially or completely convert the radiation generated during operation of the semiconductor chip into preferably a radiation with a longer wavelength.

According to at least one embodiment, the fluorescent body terminates flush with the cast body in a direction pointing away from the mounting region. This means that the fluorescent body and the cast body may have the same height. In this case, the fluorescent body preferably comprises an electrical through-connection, which extends from the electrical line, which runs along the top side of the cast body and thus along a top surface of the fluorescent body, to the chip top side. In other words, the through-connection passes through the fluorescent body and connects the electrical line to the chip top side. The through-connection preferably only passes through the fluorescent body.

According to at least one embodiment, the chip top side terminates flush with the cast body in a direction pointing away from the mounting region. This makes it possible that any fluorescent body that may be present projects beyond the cast body and/or is partially arranged on the cast body.

Therefore it possible that the semiconductor device is free of electrical through-connections.

According to at least one embodiment, the reduced thickness is at least 10% or 20% and/or at most 55% or 40% or 35% of the full thickness. This means that the reduced thickness is relatively small.

According to at least one embodiment, the full thickness of the lead frame parts is at least 50 µm or 70 µm or 100 µm and/or at most 1 mm or 0.5 mm or 0.26 mm. Alternatively or additionally, a minimum distance between adjacent lead frame parts is at least 50 µm or 0.1 mm or 0.18 mm and/or at most 1 mm or 0.5 mm or 0.2 mm. The lead frame parts can thus be arranged comparatively close together.

According to at least one embodiment, the minimum distance between adjacent lead frame parts is at least 50% or 60% or 90% and/or at most no % or 100% or 90% of the full thickness of the lead frame parts.

According to at least one embodiment, the top side of the cast body facing away from the mounting region is curved when viewed in cross-section. Alternatively, the top side may be straight when viewed in cross-section, especially from the chip top side to the lead frame parts. It is possible that the top side of the cast body rises steadily from the chip top side to the connection region. Alternatively, it is possible that the top side of the cast body first drops off from the top side and then rises continuously towards the connection region. Preferably, the top side of the cast body is stepless, especially like a differentiable curve.

According to at least one embodiment, the semiconductor chip projects laterally beyond the lead frame part with the mounting region, especially in a direction parallel to the mounting region. For a lateral projection P of the semiconductor device over the relevant lead frame part, the following applies, especially when viewed in cross-section, as a function of the full thickness D2 and the reduced thickness D1: $0.3*(D2-D1) \leq P \leq 2*(D2-D1)$ or $0.4*(D2-D1) \leq P \leq 1.5*(D2-D1)$. Alternatively or additionally, the following applies with regard to a mean edge length E of the chip top side: $P \leq 0.4*E$ or $P \leq 0.3*E$. Furthermore, the following may apply: $0.1*E \leq P$.

According to at least one embodiment, the cast body is not transmissive for light. For example, the cast body is black to increase contrast or appears white to an observer with a high diffuse reflectivity. Alternatively, the cast body is permeable to the radiation generated during operation, especially transparent or milky dim.

According to at least one embodiment, the lead frame parts are partially or completely coated with a reflective coating. Such a coating includes, for example, silver or aluminum, especially for the reflection of blue light. As an alternative to metallic coatings, a dielectric mirror and/or a Bragg mirror may also be present. It is possible that such a coating is limited to the trough.

According to at least one embodiment, the semiconductor device comprises two or more than two different types of semiconductor chips. One or more of the semiconductor chips may be provided per type. For example, there are semiconductor chips for generating red light, green light and blue light. The semiconductor device can be an RGB device. Preferably, the different types of semiconductor chips are electrically controllable independently of each other. Similar semiconductor chips can also be electrically controllable independently of each other or they can be grouped together.

In addition, a method for producing optoelectronic semiconductor devices is specified. The method is used to produce a semiconductor device as described in connection with one or more of the above mentioned embodiments. Features of the semiconductor device are therefore also disclosed for the method and vice versa.

In at least one embodiment the method comprises the following steps, preferably in the given order:

A) providing a semi-etched lead frame composite comprising a plurality of lead frames, wherein each of the lead frames comprises a plurality of the lead frame parts and is intended for one of the finished semiconductor devices, B) placing the semiconductor chips on the lead frames, C) creating the cast body, D) creating the electrical lines and electrical wirings between the lead frames, where the wirings electrically connects platforms of adjacent lead frames, and E) cutting through connecting bridges between the lead frames so that an electrical connection between adjacent lead frames is only provided via the wirings.

As an alternative to semi-etching, the lead frames can also be punched.

Before cutting through the connecting bridges, the individual lead frames in the lead frame composite are electrically short-circuited with each other. This means that no efficient electrical testing of individual semiconductor chips can be carried out before cutting through. By creating the wirings, it is possible to carry out a test in the lead frame compound as long as the cast body has not yet been cut through and the lead frame parts are mechanically firmly connected to each other.

The wirings can be designed according to the electrical lines, i.e., as planar interconnect. With a suitable design of the lead frame parts and a suitable interconnection of the semiconductor chips to form a matrix, efficient electrical testing is thus possible while still in the lead frame compound. In particular, the term "wiring" does not refer to connections via wires such as bonding wires.

The electrical connections, especially the wirings, can be crossed by using solid material areas of the lead frame parts as through-connections to connect planar interconnect lines to the other side of the respective lead frame part. The superfluous and/or disturbing electrical connections on this other side of the lead frame part are interrupted, in particular by sawing in the lead frame composite, whereby the cast body still remains intact as a mechanical unit. This allows the devices to be electrically tested before they are separated and, optionally, they can also be pre-sorted or wired into groups, for example for a display device such as a display.

According to at least one embodiment, the method comprises a step F), which follows step E). In step F) the semiconductor chips and/or the lead frames are tested.

According to at least one embodiment, the method comprises a step G). In step G) a separation to the semiconductor devices is carried out, wherein the cast body and the wirings are cut through. A grouping of several lead frames can be retained.

According to at least one embodiment, the electrical lines are created together with the wirings in step F). The electrical lines and the wirings can be designed identically.

According to at least one embodiment, in step F) the electrical lines and the wirings are the only electrical connections in the lead frame composite, apart from the lead frame parts and the semiconductor chips themselves. In particular, there are no electrical through-connections.

According to at least one embodiment, the platforms to which the wirings are attached have the full thickness of the lead frame parts. It is possible that the pedestals are without function in the finished semiconductor devices. Alternatively or additionally, the platforms can be used for testing the semiconductor devices in a not yet separated state, for example for contact needles. It is also possible that the platforms serve as contact surfaces for bonding wires or for ribbon contacts in the finished semiconductor devices.

According to at least one embodiment, a width of the electrical lines and/or the wirings is at least 10 µm or 20 µm or 30 µm each and alternatively or additionally at most 200 µm or 150 µm or 100 µm or 80 µm. A thickness of the electrical lines and/or the wirings is preferably at least 1 µm or 2 µm or 4 µm and/or at most 100 µm or 40 µm or 20 µm or 10 µm.

According to at least one embodiment, step C) is carried out using Film Assisted Molding (FAM). When a material of the cast body is filled in, the chip top sides and the connection regions are thus covered with a spraying film. The spraying film can compensate for slight differences in height between the connection regions and the chip top sides. After creating the cast body, the spraying film is preferably removed completely.

BRIEF DESCRIPTION OF THE DRAWINGS

In the following, an optoelectronic semiconductor device described here and a method described here are explained in more detail with reference to the drawing using exemplary embodiments. Identical reference signs indicate identical elements in the individual figures. However, no scale references are shown; individual elements may be shown in exaggerated size for better understanding.

DETAILED DESCRIPTION OF ILLUSTRATIVE EMBODIMENTS

Figure 1:
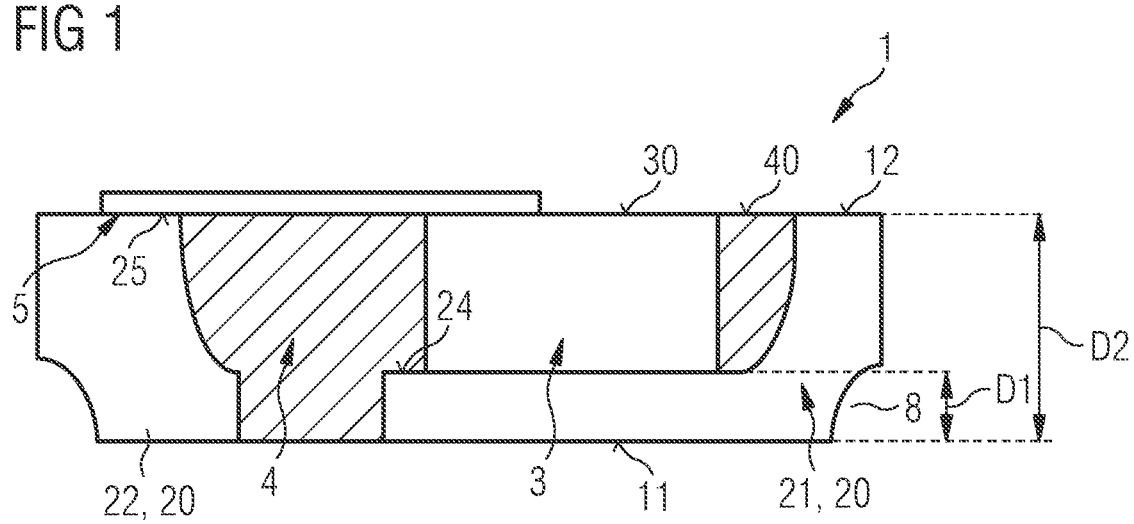
FIG. 1 shows a schematic sectional view of an example of an optoelectronic semiconductor device.

FIG. 1 shows an example of an optoelectronic semiconductor device 1. The semiconductor device 1 comprises a lead frame 20, which is composed of a first lead frame part 21 and a second lead frame part 22. The first lead frame part 21 comprises a region of reduced thickness. This region forms a mounting region 24. A semiconductor chip 3, preferably a light emitting diode chip, is mounted in the mounting region 24. A chip top side 30 of the semiconductor chip 3 is facing away from the mounting region 24. An electrical contact of the semiconductor chip 3 is made via the first lead frame part 21 and by means of an electrical line 5 to the second lead frame pall 22. The semiconductor device 1 can be surface mounted on a bottom side 11, for example by soldering.

The semiconductor chip 3 is embedded in a cast body 4. The cast body 4 firmly connects the lead frame parts 21, 22 to each other. Preferably, a top side 40 of the cast body 4 is flush with the chip top side 30 and with a connection region 25 on the second lead frame part 22. This allows the electrical line 5 to run essentially parallel to the mounting region 24. For the electrical contacting of the semiconductor chip 3, electrical through-connections can thus be dispensed with.

At the mounting region 24, the first lead frame part 21 has a relatively small reduced thickness D1. A total thickness D2 of the lead frame parts 21, 22 is approximately 3 times the reduced thickness D1.

It is possible that at edges and/or corner areas at the bottom side 11 of the semiconductor device 1, the lead frame parts 21, 22 each have a cut-out 8. The cut-out 8 can be free of the cast body 4. The bottom side 11 is opposite to an emission side 12, whereby preferably the chip top side 30 is in the emission side 12.

Figure 2A:
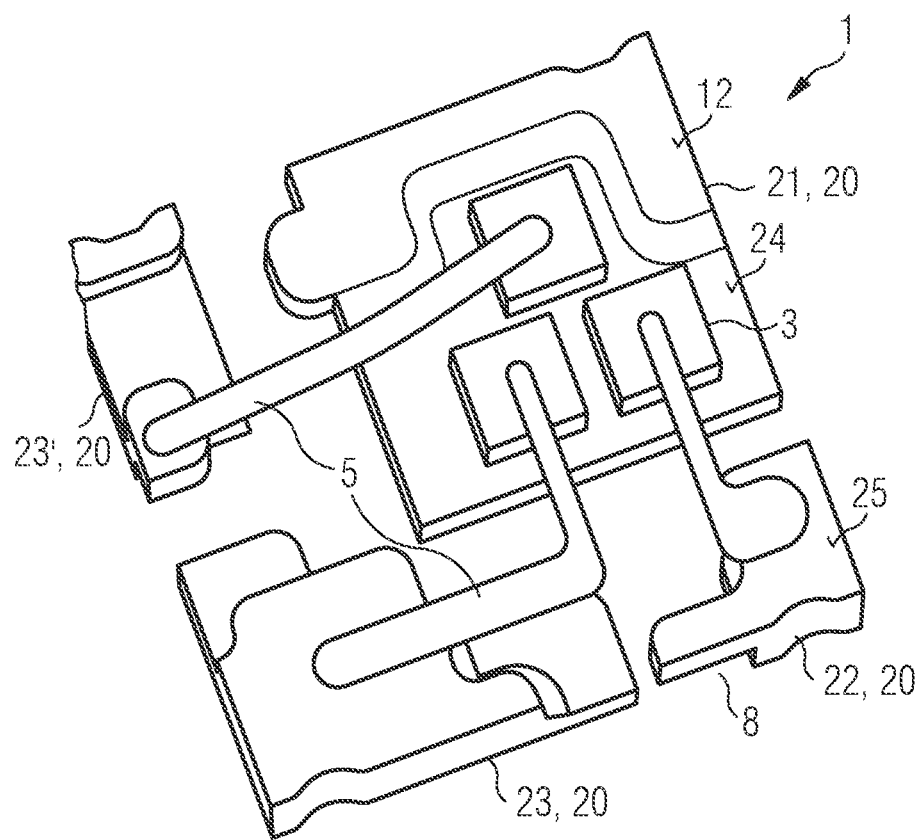
FIGS. 2A, 3A, 4A, 5 and 6A show schematic perspective top views of exemplary embodiments of optoelectronic semiconductor devices.

In the exemplary embodiment of FIG. 2, three of the semiconductor chips 3 are located on the first lead frame part 21. One of the semiconductor chips 3 is preferably configured to generate red light, another to generate green light and a third of the semiconductor chips 3 to generate blue light. Preferably the semiconductor chips 3 are all of the same height. The cast body in which the semiconductor chips 3 are embedded is not shown in FIG. 2 to simplify the representation.

The semiconductor chips 3 are each connected to one of a total of three electrical lines 5 and are electrically connected via these lines 5 to the lead frame parts 22, 23, 23'. The lead frame parts 21, 22, 23, 23' form a trough-shaped area, seen from the emission side 12, in which the semiconductor chips 3 are located, see FIG. 2A.

Figure 2B:
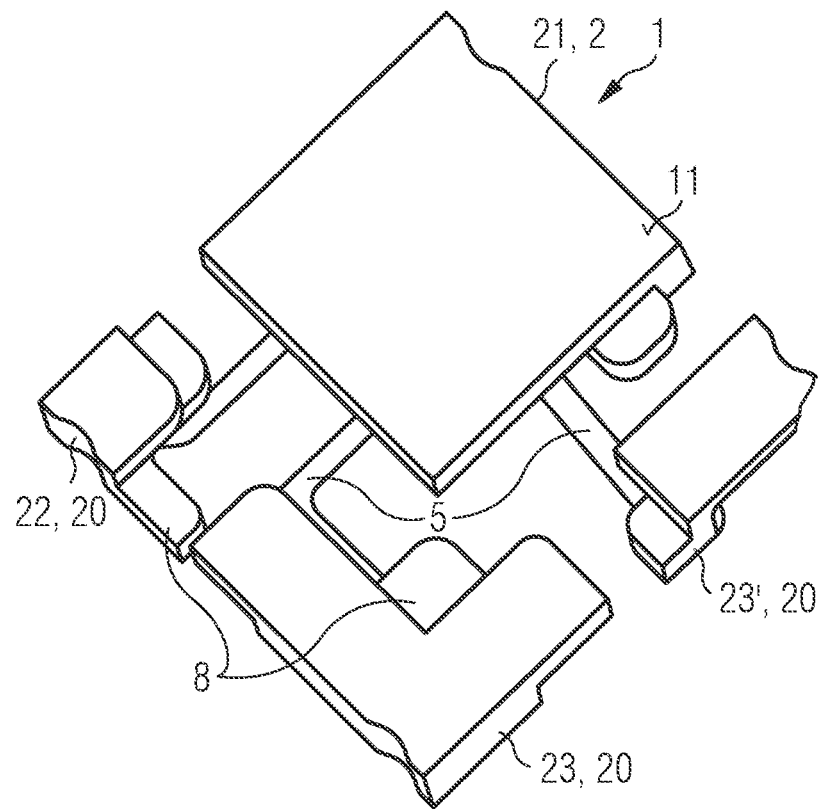
FIGS. 2B, 3B, 4B and 6B show schematic perspective bottom views of examples of optoelectronic semiconductor devices.

FIG. 2B shows that the semiconductor device 21 with the semiconductor chips 3 is approximately square-shaped on the bottom side 11. The other lead frame parts 22, 23, 23' are L-shaped or rectangular and are located at corners of the bottom side 11. Furthermore, the lead frame parts 21, 22, 23, 23' are also partially etched from the bottom side 11 and thus partially thinned from the bottom side 11.

Figure 3A:
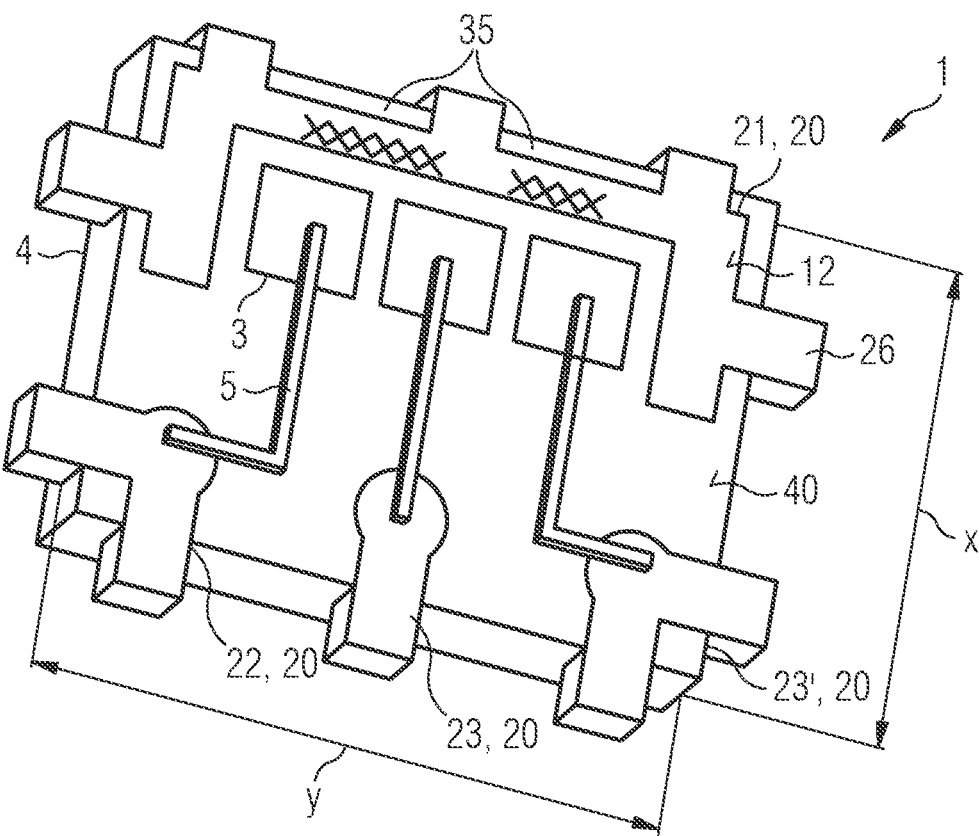

In the exemplary embodiment of FIG. 3, the semiconductor chips 3 are arranged in a linear arrangement, unlike the triangular arrangement in FIG. 2. As illustrated in FIG. 3A, the first lead frame part 21 can surround the semiconductor chips 3 U-shaped. The other lead frame parts 22, 23, 23' are L-shaped or approximately rectangular in top view and are connected to the corresponding semiconductor chip 3 via electrical lines 5, see FIG. 3A.

Figure 3B:
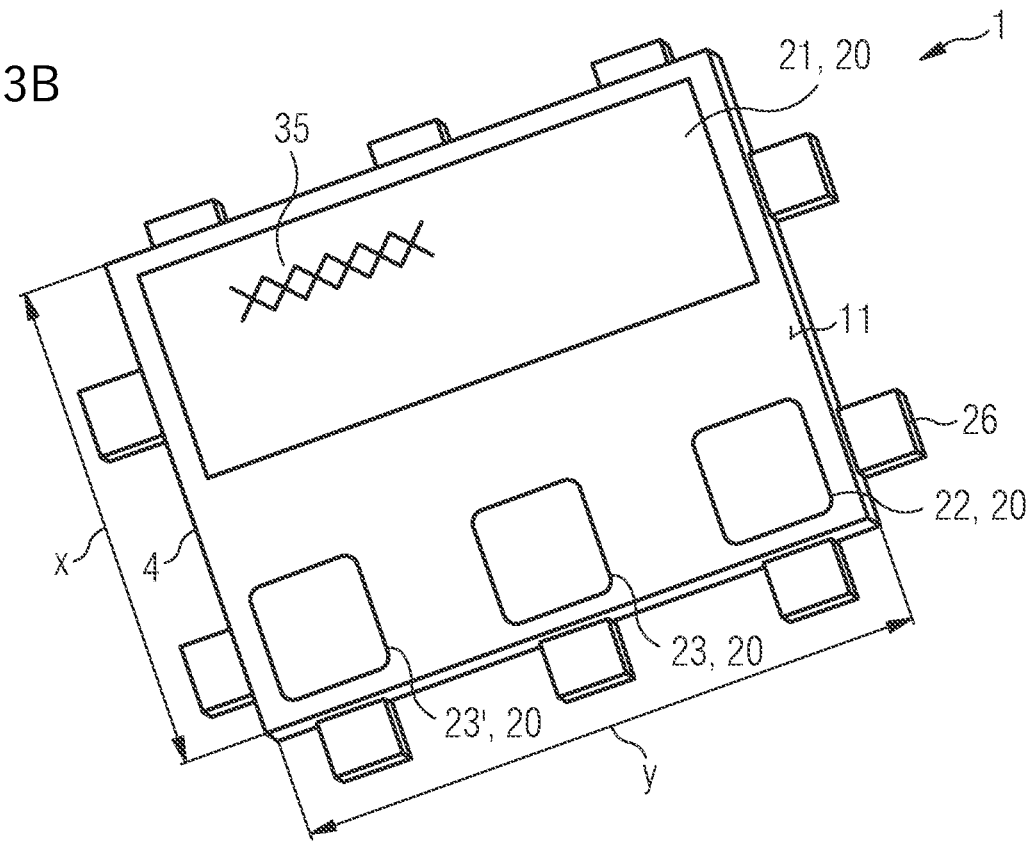

From the bottom side 11, see FIG. 3B, the lead frame part 21 is rectangular in shape and the other lead frame parts 22, 23, 23', which are smaller, are each square in shape.

Preferably, as in all other exemplary embodiments, there is a marking 35 on the emission side 12 and/or on the bottom side 11 of the lead frame parts 21, 22, 23, 23'. The marking 35 is produced by etching, punching or laser writing, for example. By means of the marking 35 it is possible to individually track the semiconductor devices 1 even during a production process and to indicate characteristic data on the semiconductor devices 1. The characteristic data are, for example, one in the generated color location.

Furthermore, FIG. 3 shows that during the production, adjacent lead frames 20 are connected to each other by connecting bridges 26. A lead frame composite 2 can be built up using the connecting bridges 26, see also FIG. 14. In the finished semiconductor device 1 the connecting bridges 26 indicated in FIG. 3 are preferably no longer present, so that the lead frame parts 21, 22, 23, 23' and thus the lead frame 20 are each flush with side surfaces of the cast body 4. The lead frame 20 therefore preferably does not protrude beyond the cast body 4.

A transverse expansion x of the semiconductor device 1, for example, is at least 0.5 mm or 0.8 mm and/or at most 4 mm or 3 mm or 1.5 mm. A longitudinal expansion y, for example, is at least 0.8 mm or 1 mm and/or at most 8 mm or 5 mm or 2 mm. The same may apply to all other examples.

The semiconductor chips 3, which can also be a mixture of light-emitting semiconductor chips and detector chips, are attached to the first lead frame part 21, for example, by soldering or electrically conductive adhesive bonding. The electrical lines 5 are, for example, produced lithographically, for example by structuring a seed layer and subsequently electrodepositing a metal for the lines 5.

Figure 4A:
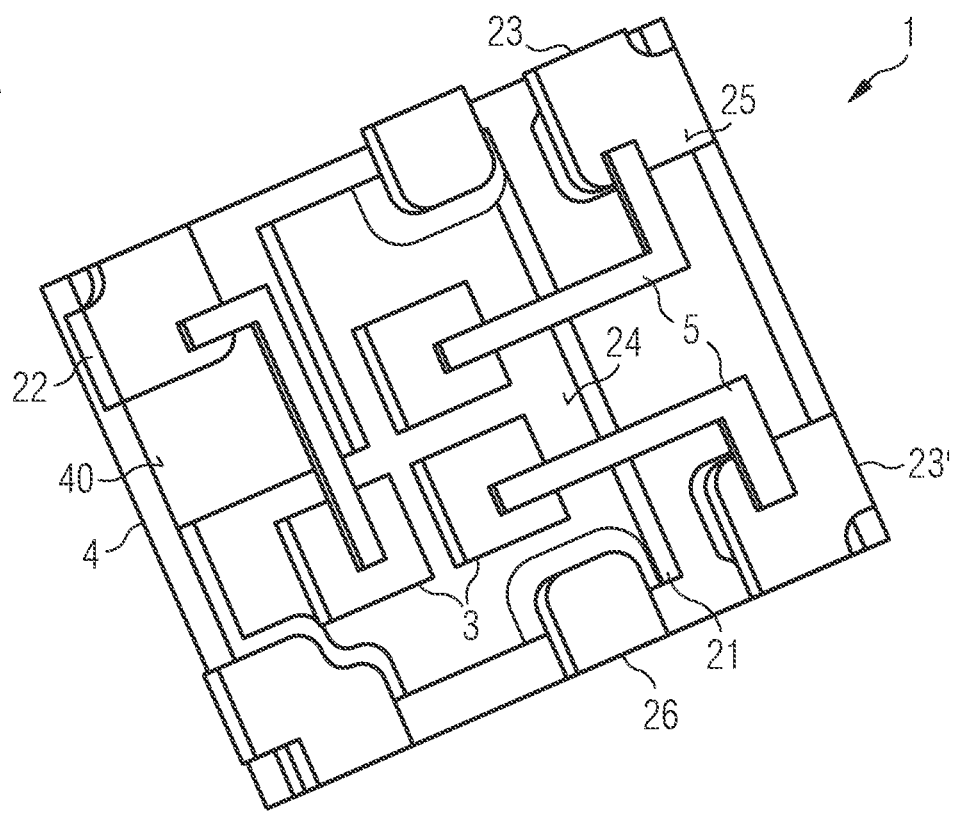
Figure 4B:
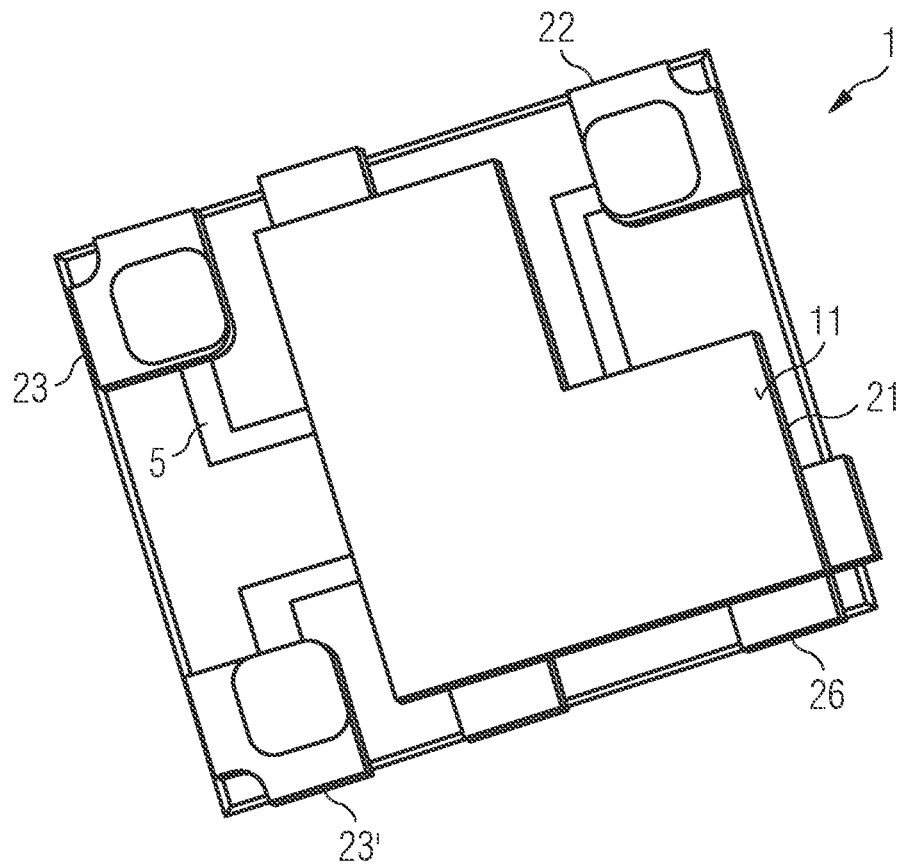

According to FIG. 4, the cast body 4 is transmissive for light. The semiconductor chips 3 are arranged in the center of the semiconductor device 1. The lead frame parts 21, 22, 23, 23' are each located at corners of the semiconductor device 1. The first lead frame part 21 is L-shaped when viewed from the bottom side 11, the other lead frame pails 22, 23, 23' are approximately square and considerably smaller.

Figure 5:
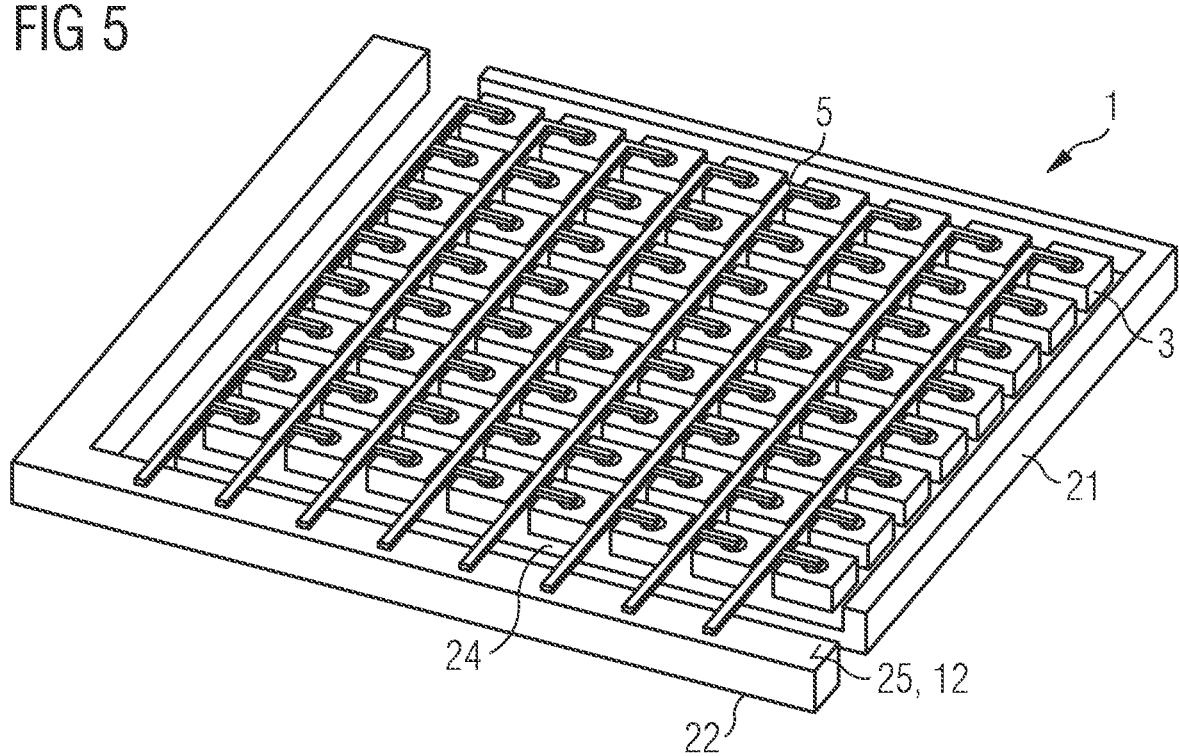

FIG. 5 illustrates that a plurality of the semiconductor chips 3 are arranged in a matrix over the only two lead frame parts 21, 22. The semiconductor chips 3 are electrically connected in parallel. The electrical lines 5 are connected to the L-shaped second lead frame part 22. The cast body is not illustrated in FIG. 5 to simplify the representation.

Figure 6A:
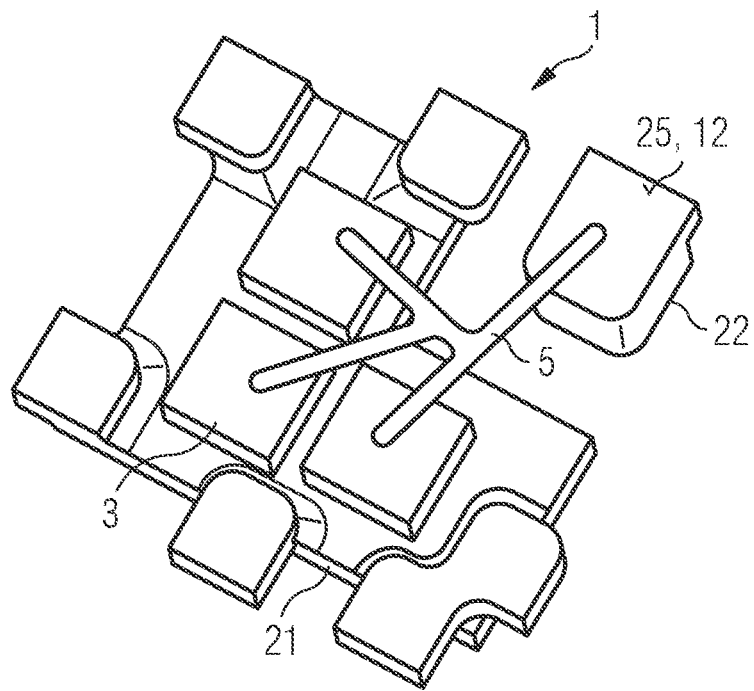
Figure 6B:
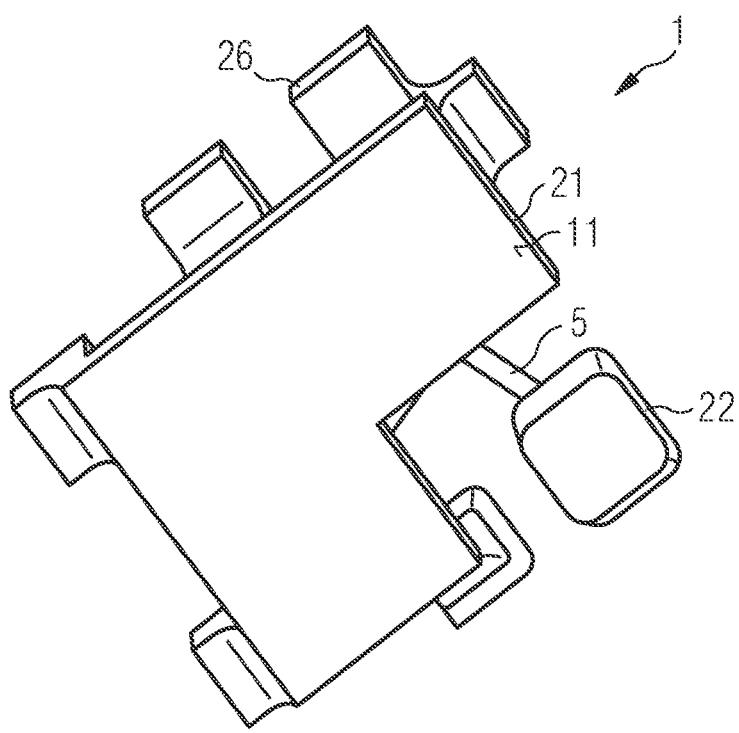

In the exemplary embodiment in FIG. 6, the three semiconductor chips 3 are electrically connected to the second lead frame pall 22 via a single electrical line 5. Again, the cast body is not shown in FIG. 6. The electrical line 5 comprises two Y-junctions, but can alternatively be star-shaped.

Furthermore, it can be seen from FIG. 6 that the lead frame parts 21, 22 are thinned in the area of the connecting bridges 26 from the bottom side 11, but can extend to the emission side 12.

Figure 7:
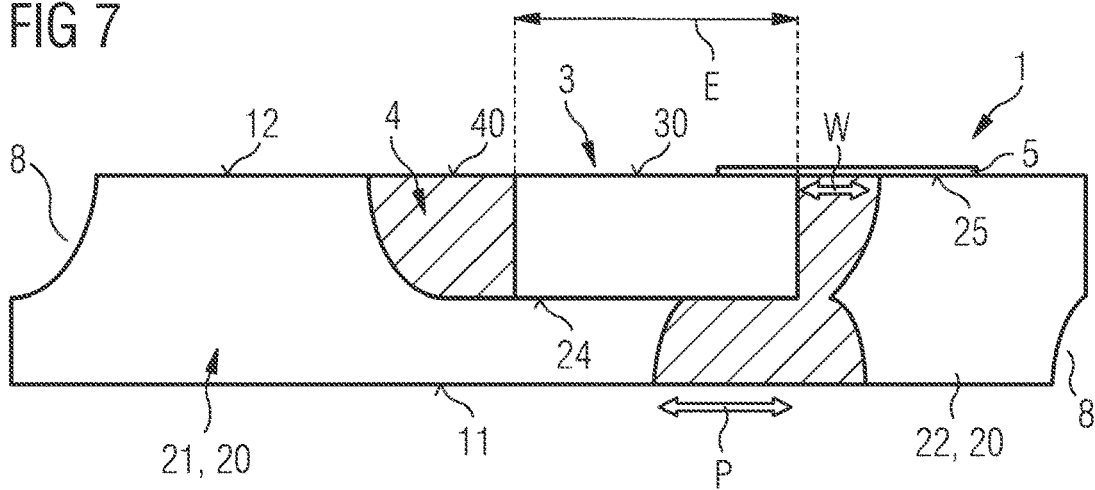
FIG. 7 shows a schematic sectional view of an example of an optoelectronic semiconductor device.

FIG. 7 illustrates that the semiconductor chip 3 protrudes with a projection P over the mounting region 24. This results in an overall saving of space. Due to the production method, a minimum distance between the lead frame parts 21, 22 should not be undercut. The minimum distance is approximately 0.2 mm, depending on the full thickness D2 of the lead frame parts 21, 22. A distance W of the semiconductor chip 3 from the second lead frame part 22, for example, is only 50 µm and thus about a quarter of the minimum distance between lead frame parts 21, 22. This means that the mounting region 24 can be made correspondingly smaller. The projection P is preferably at most 40% of an edge length E of the chip top side 30.

Figure 8A:
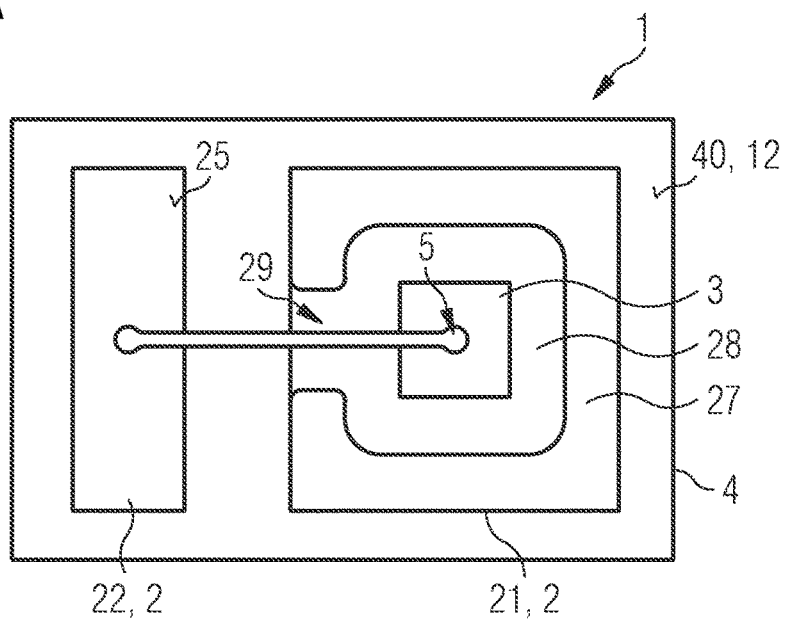
FIG. 8A shows a schematic top view of an example of an optoelectronic semiconductor device.
Figure 8B:
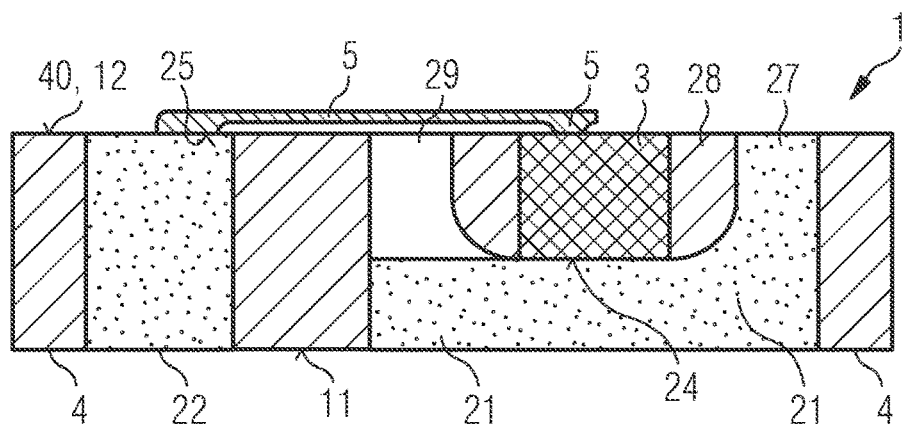
FIGS. 8B, 9, 10, 11C, 12, 13A and 13B and 16A, 16B and 16C show schematic sectional views of examples of optoelectronic semiconductor devices.

FIG. 8 illustrates that the semiconductor chip 3 is located in a trough 28, which is designed as a reflector. The trough 28 is surrounded by a wall 27 essentially all around it. The wall 27 has the full thickness D2. To prevent a short circuit of the first lead frame part 21 with electrical line 5, the wall 27 has a recess 29 towards the second lead frame part 22. The recess 29 reaches preferably up to the mounting region 24.

Figure 9:
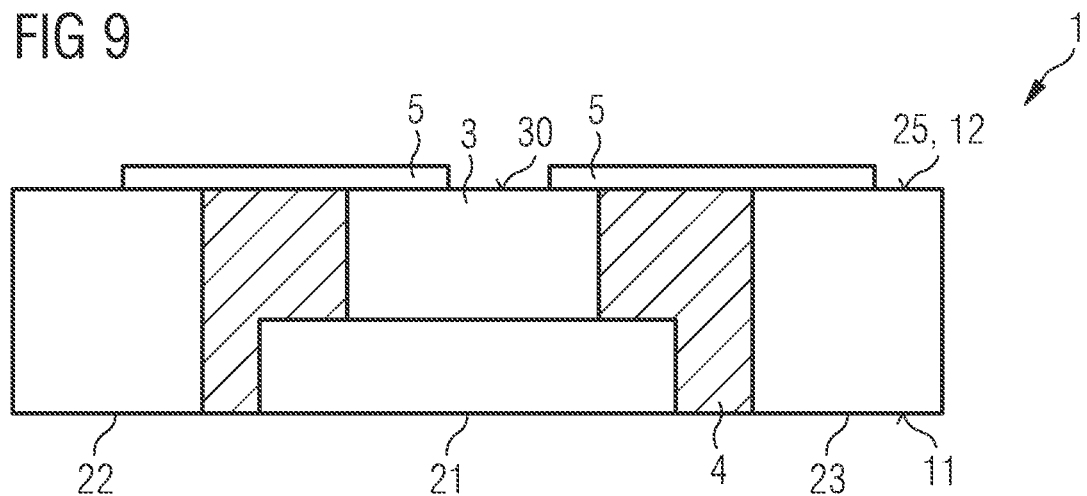

FIG. 9 illustrates that the semiconductor chip 3 can have all electrical connections on the chip top side 30. An electrical contact is made via several of the electrical lines 5.

Figure 10:
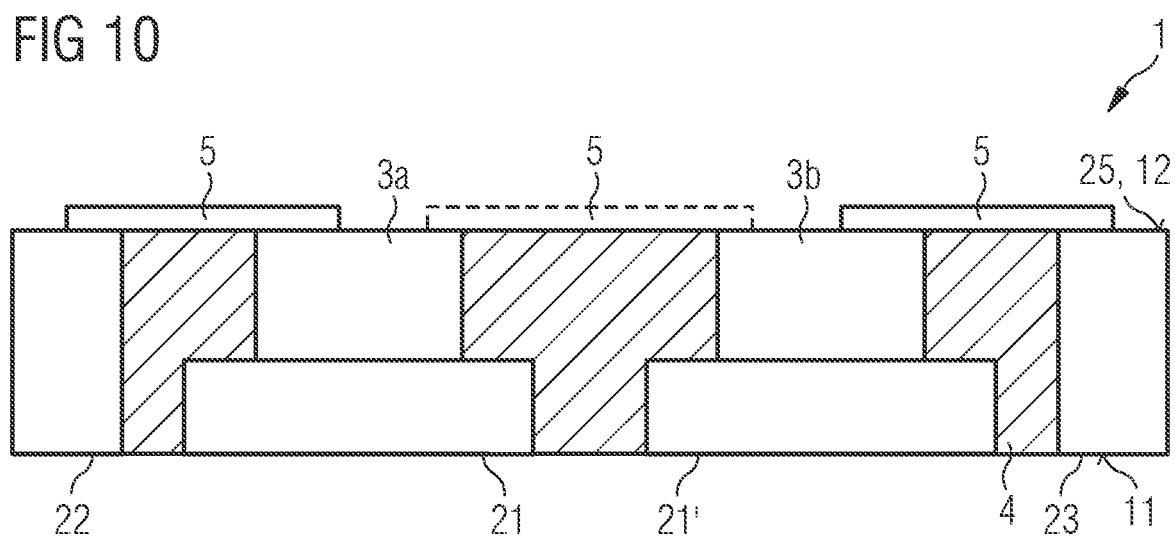

According to FIG. 10, the semiconductor chips 3a, 3b are arranged on several first lead frame parts 21, 21'. The semiconductor chip 3a, for example, is an LED chip. The semiconductor chip 3b can be a chip for protection against damage caused by electrostatic discharge, or ESD chip for short. In this case, the semiconductor chips 3a, 3b are connected, for example, via one of the electrical lines 5, shown as dashed lines in FIG. 10.

Figure 11A:
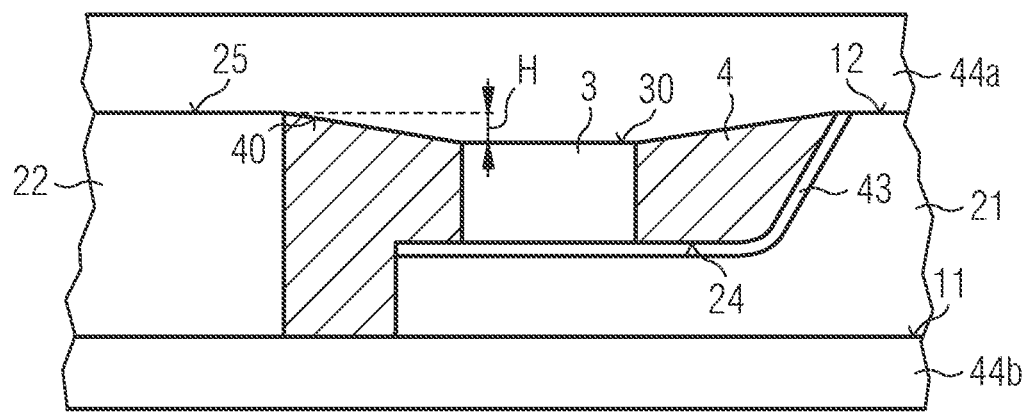
FIGS. 11A and 11B show schematic sectional views of method steps in a method for producing exemplary embodiments of optoelectronic semiconductor devices.
Figure 11B:
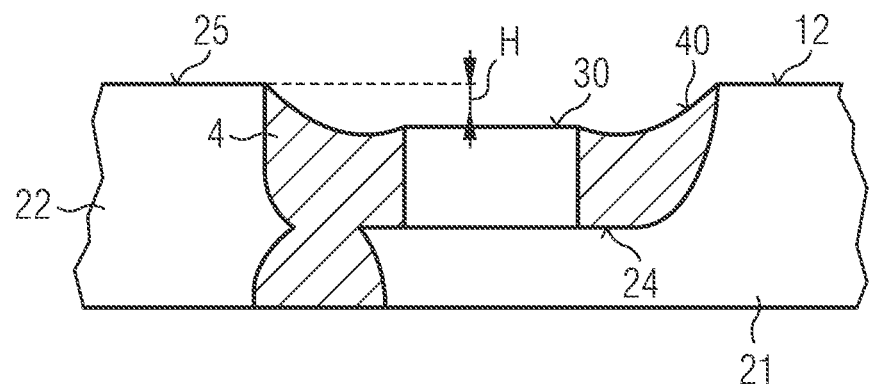

FIGS. 11A, 11B show steps for producing the cast body 4. According to FIG. 11A, the cast body 4 is produced by film-assisted injection or injection molding. A spraying film 44a seals the connection regions 25 and the chip top sides 30. A height projection H of the lead frame parts 21, 22 over the chip top side 30 is at most 20 µm and is as small as possible. The height projection H is compensated by the spraying film 44a. The top side 40 of the cast body 4, seen in cross-section, runs straight from the chip top side 30 to the lead frame parts 21, 22. Sealing is achieved towards the bottom side 11 by means of a further spraying film 44b.

As in all exemplary embodiments, it is possible that at least the first lead frame part 21 is completely or partially covered with a reflective coating 43. This can increase reflectivity, especially for blue light, since the lead frame parts 21, 22 are made of copper or a copper alloy, for example, which reflects blue light relatively poorly.

According to FIG. 11B, the cast body 4 is produced by casting. Minisks are formed on the top side 40 due to wetting and surface tension of a material of the cast body 4. This means that the cast body 4 can first thin out from the chip top side 30 and then pull up to the emission side 12 with the connection region 25.

Figure 11C:
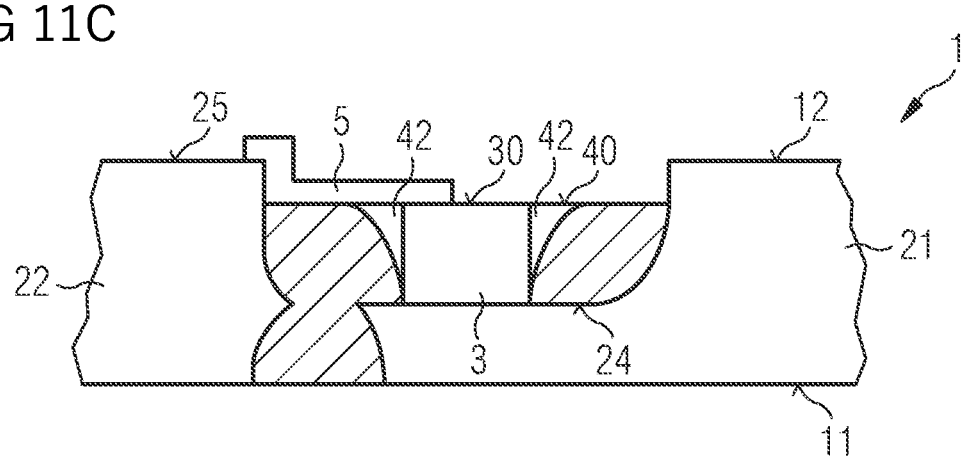

In the example of FIG. 11C, the top side 40 is oriented parallel to the mounting region 24. This means that a step can be formed in the electrical line 5 towards the second lead frame part 22 at connection region 25. This step, however, has only a low height. Since the lead frame part 22 is also electrically conductive on side surfaces, such a step does not normally endanger the electrical contact. Such steps are avoided in FIGS. 11A and 11B.

As in all exemplary embodiments, it is also possible as an option that side surfaces of the semiconductor chip 3 are covered with a transparent encapsulation 42. The transparent encapsulation 42 allows a more directed radiation away from the mounting region 24, especially if the semiconductor chip 3 has a transparent substrate. In this case, the cast body 4 is preferably reflective, for example white.

Figure 12:
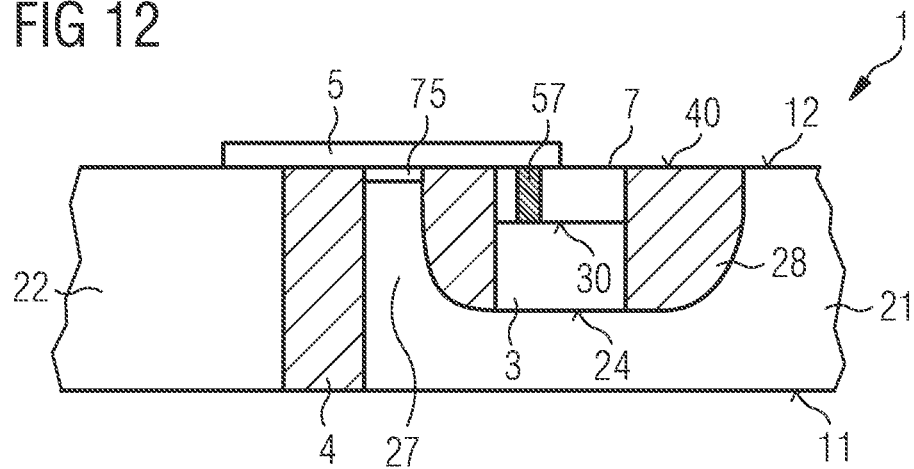

FIG. 12 shows that a fluorescent body 7 is applied to the chip top side 30. The fluorescent body 7 is flush with the cast body 40. Thus, the electrical line 5 extends partially over the fluorescent body 7. Electrical contact to the semiconductor chip 3 is established via an electrical through-connection 57 through the fluorescent body 7. However, the through-connection 57 is comparatively short in the direction perpendicular to the mounting region 24 and can therefore be produced relatively cost-effectively.

Optionally, as in all exemplary embodiments, an electrical insulating layer 75 is provided in places on the first lead frame part 21. Such an insulating layer 75 can in particular replace the recess 29 of FIG. 8. Thus, the insulating layer 75 can partially or completely cover the wall 27.

Figure 13A:
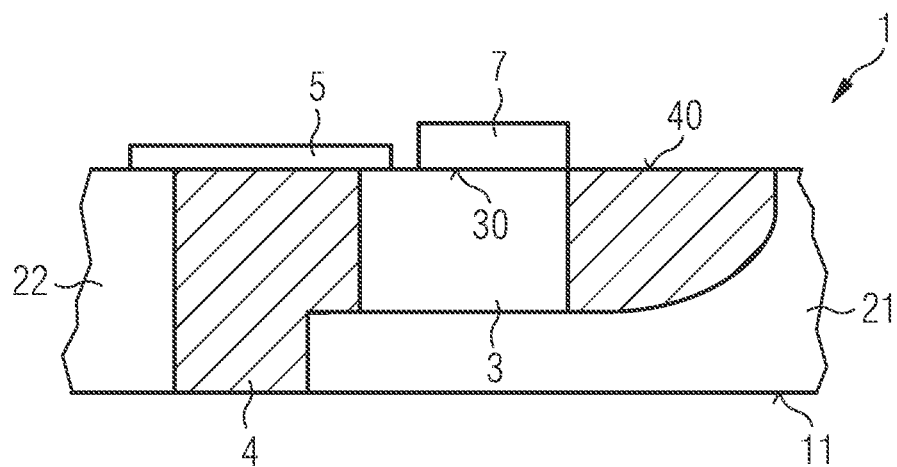
Figure 13B:
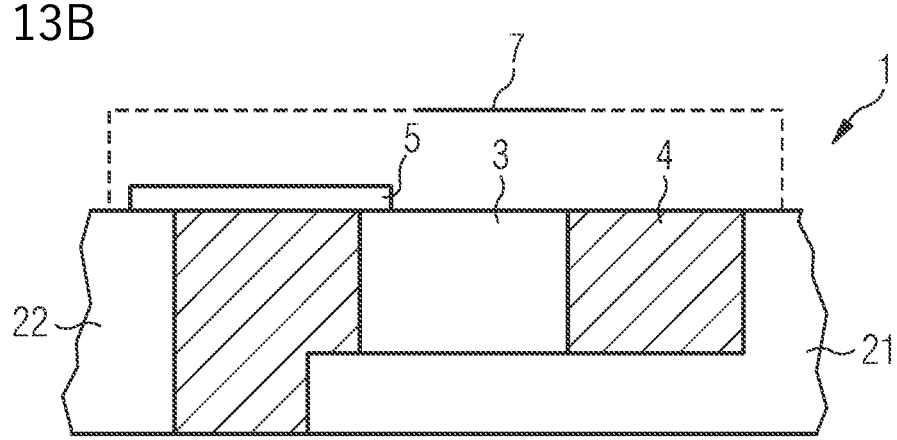

In contrast, the fluorescent body 7 of FIG. 13A protrudes above the cast body 4. Deviating from the illustration, the fluorescent body 7 can also extend to the top side 40 of the cast body 4. The fluorescent body 7 also protrudes above the electrical line 5 and can also extend to the top side 40 of the cast body 4 as shown in the illustration in FIG. 13B. Optionally, the fluorescent body 7 covers the electrical line 5 and/or the connection region 25, as indicated by dashed lines in FIG. 13B.

A producing method is illustrated in FIG. 14. According to FIG. 14A, a lead frame composite 2 is provided with a plurality of lead frames 20 each with, for example, two lead frame parts 21, 22. The lead frames 20 each comprise a connection region 25 with the full thickness D2 and several platforms 62, also with the full thickness D2. In addition, each lead frame 20 comprises a mounting region 24 with the reduced thickness D1.

Adjacent lead frames 20 are connected to each other via the connecting bridges 26 and are thus mechanically integrated. Contrary to the illustration in FIG. 14, diagonally running connecting bridges 26' may also be present, schematically illustrated as dashed lines in FIG. 14A. These connecting bridges 26' allow the lead frame composite 2 to be designed as a single piece.

As shown in FIG. 14, one of the platforms 62 is on the first lead frame part 21 and two of the platforms 62 are on the second lead frame part 22, although several of the platforms 62 may also be attached to the first lead frame parts 21.

Figure 14A:
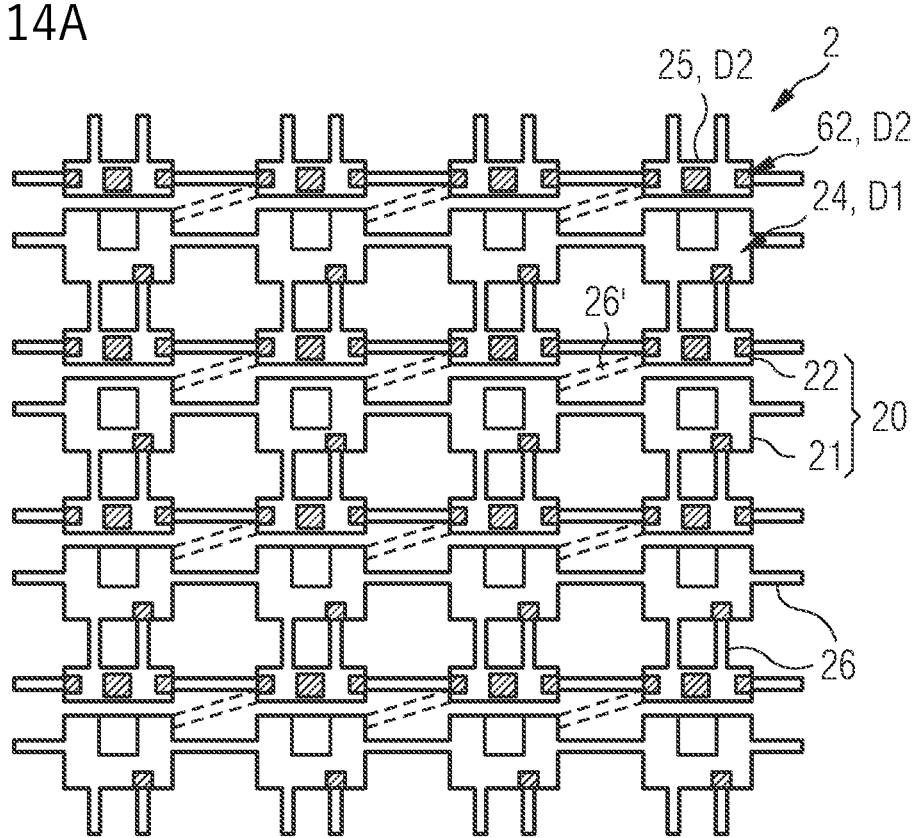
FIGS. 14A, 14B, 14C and 14D show schematic plan views of method steps in a method for producing exemplary embodiments of optoelectronic semiconductor devices.
Figure 14B:
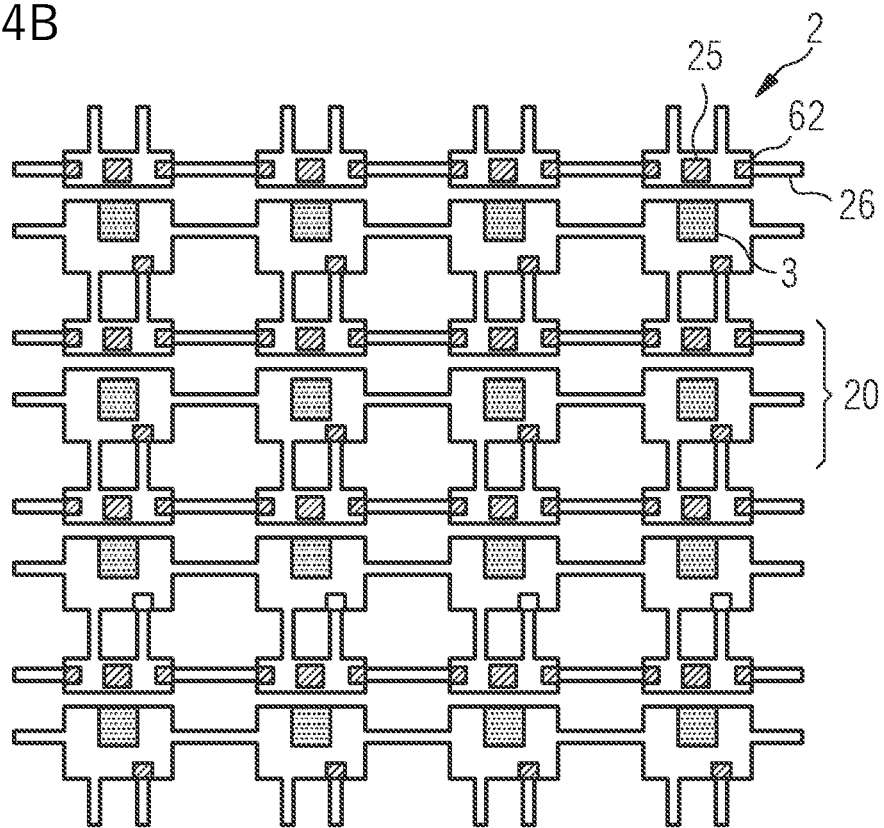
Figure 14C:
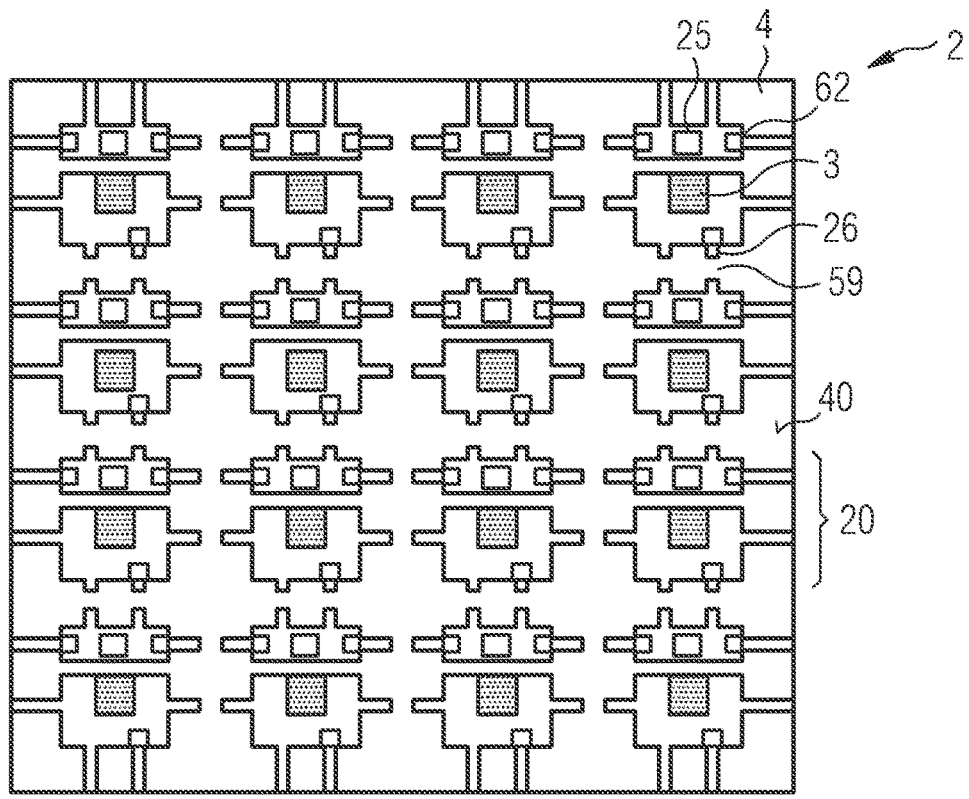

In the method step in FIG. 14B, the lead frames 20 are each loaded with one of the semiconductor chips 3. Then the cast body 4 is created, see FIG. 14C. After creating the cast body 4, the connecting bridges 26 are separated from the bottom side 11 so that interruptions 59 result and the lead frames 20 are electrically separated.

The separation of the lead frames 20 is related to individual lead frames 20 as shown in FIG. 14. In deviation from this, groups of lead frames 20 can also remain connected together.

Figure 14D:
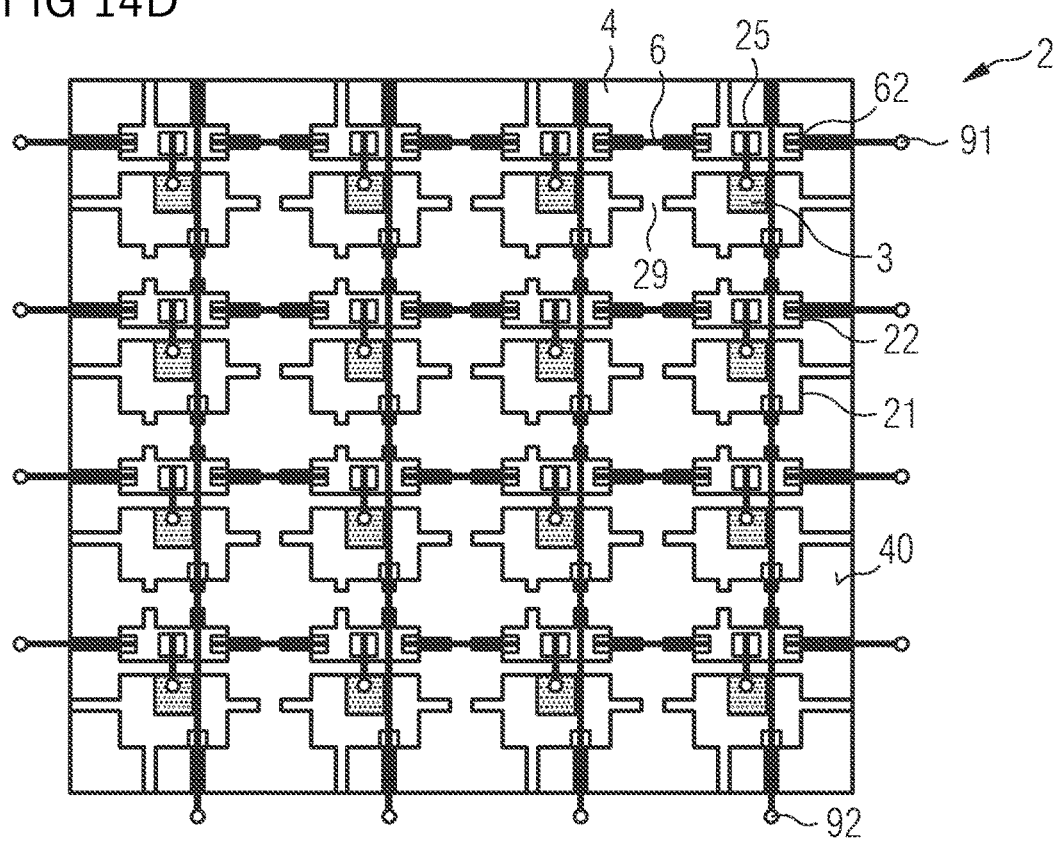

In the step in FIG. 14D, electrical lines 5 and also electrical wirings 6 are created. This is done in a common step and the electrical lines 5 are preferably constructed in the same way as the wirings 6. The wirings 6 are located at the top side 40 of the cast body 4, like the electrical lines 5, and run in a common plane with them.

Along rows and columns, continuous electrical connections can be created via the wirings 6 together with the associated lead frame parts 22. Via the platforms 62 on the first lead frame parts 21, a column-by-column connection can be made. The platforms 62 on the first lead frame parts 21 are positioned in left-right direction between the platforms 62 of the second lead frame parts 22, so that short circuits are avoided. A single, individual testing of the lead frames 20 and the corresponding semiconductor chips 3 is then carried out via test contacts 91, 92 for rows and columns.

Contrary to FIG. 14, the generation of the interruptions 59 can also take place after the electrical lines 5 and the wirings 6 have been created.

Figure 15:
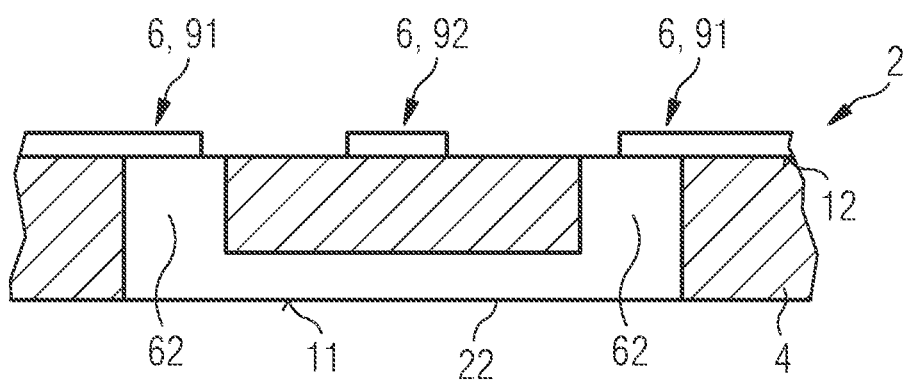
FIG. 15 shows a schematic sectional view of a lead frame composite for the production of exemplary embodiments of optoelectronic semiconductor devices described here.

FIG. 15 illustrates that the wiring 6 for the row test contacts 91 integrates the second lead frame parts 22. These wirings 6, 91 run from left to right in FIG. 15, exactly as in FIG. 14D. The wirings 6 for the column test contacts 92 are perpendicular to the drawing plane in FIG. 15 and from top to bottom in FIG. 14D.

By using the semi-etched lead frames in conjunction with the wirings 6, two wiring levels can thus be achieved, on the one hand on the bottom side 11 via the lead frame parts 21, 22 and on the other hand on the emission side 12 via the platforms 62 together with the wirings 6. This means that bonding wires in particular can be omitted. Through-connections can therefore be replaced by the semi-etching and the associated creation of the platforms 62.

In FIG. 1.6A the semiconductor chip 3 is connected through the fluorescent body 7. The fluorescent body 7 and/or the cast body 4 can be flush with the electrical line 5 on the emission side 12. The through-connection 57 can have different depths, with the through-connection 57 on the second lead frame part 22 being optional. The through-connection 57 to the chip top side 30 runs through the fluorescent body 7.

Figure 16A:
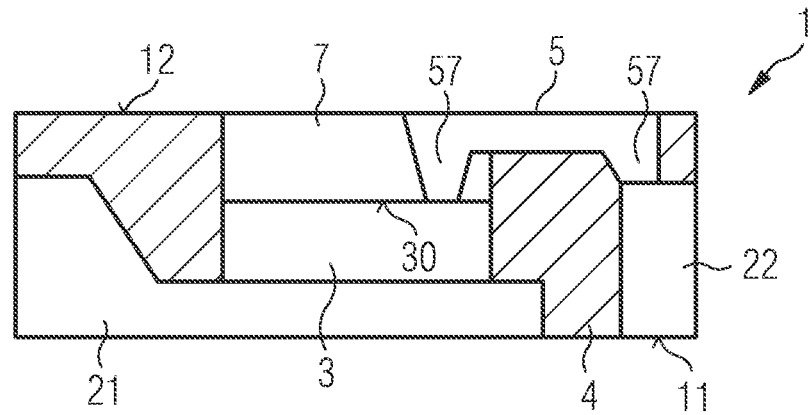
Figure 16B:
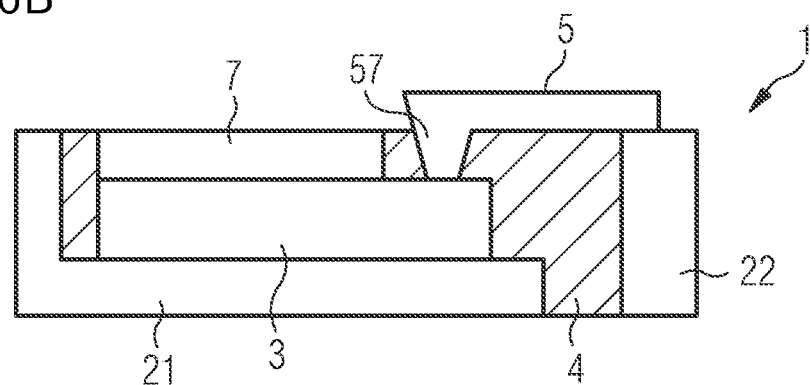

In FIG. 16B the through-connection 57 to the chip top side 30 is located next to the fluorescent body 7 in the cast body 4. Furthermore the electrical line 5 protrudes over the fluorescent body 7 and the cast body 4. The latter is possible in the same way in the example of FIG. 16A.

Figure 16C:
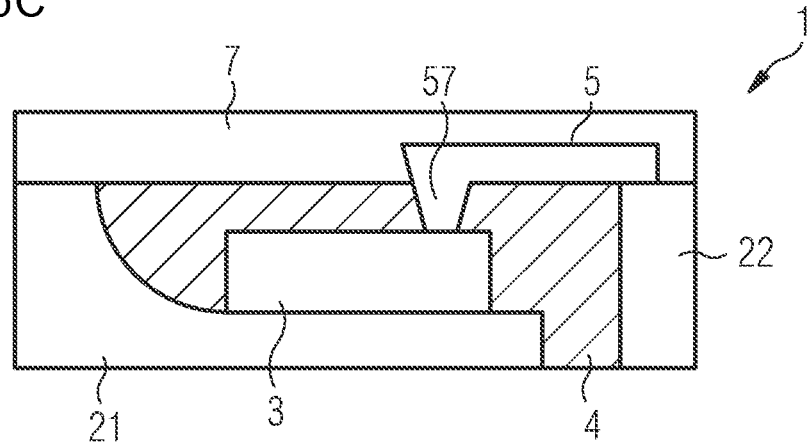

In the example of FIG. 16C, the fluorescent body 7 is located as a preferably continuous layer above the electrical line 5, the semiconductor chip 3 and the cast body 4. The through-connection 57, especially through the cast body 4, is optionally provided. Furthermore, it is possible that the fluorescent body 7 is limited to the cast body 4 and leaves the lead frame parts 21, 22 completely or partially free, different to FIG. 16C.

Unless otherwise indicated, the components shown in the figures follow each other, preferably in the order indicated. Layers not touching each other in the figures are preferably spaced apart. Where lines are drawn parallel to each other, the corresponding surfaces are preferably also parallel to each other. Likewise, unless otherwise indicated, the relative positions of the drawn components to each other are correctly shown in the figures.

The invention is not restricted to the exemplary embodiments by the description on the basis of said exemplary embodiments. Rather, the invention encompasses any new feature and also any combination of features, which in particular comprises any combination of features in the patent claims and any combination of features in the exemplary embodiments, even if this feature or this combination itself is not explicitly specified in the patent claims or exemplary embodiments.

The invention claimed is:

1. An optoelectronic semiconductor device comprising:
   at least two lead frame parts;
   at least one optoelectronic semiconductor chip arranged on a mounting region on one of the lead frame parts;
   a cast body mechanically connecting the lead frame parts to one another and in which the semiconductor chip is embedded; and
   at least one electrical line,
   wherein the semiconductor chip comprises a chip top side facing away from the mounting region,
   wherein the respective lead frame part has a reduced thickness in the mounting region,
   wherein the electrical line is arranged across the cast body and is directly arranged on the cast body from the semiconductor chip to a connection region of the other of the lead frame parts,
   wherein the other lead frame part has a full thickness in the connection region,
   wherein the electrical line overcomes a difference in height of at most 20 μm in a direction perpendicular to the mounting region along its entire path from the connection region to the semiconductor chip, and
   wherein the connection region is higher than the chip top side.

2. An optoelectronic semiconductor device comprising:
   at least two lead frame parts;

at least one optoelectronic semiconductor chip arranged on a mounting region on one of the lead frame parts;
a cast body mechanically connecting the lead frame parts to one another and in which the semiconductor chip is embedded;
a fluorescent body arranged on a chip top side; and
at least one electrical line,
wherein the semiconductor chip comprises the chip top side facing away from the mounting region,
wherein the respective lead frame part has a reduced thickness in the mounting region,
wherein the electrical line is arranged across the cast body and is directly arranged on the cast body from the semiconductor chip to a connection region of the other of the lead frame parts,
wherein the other lead frame part has a full thickness in the connection region,
wherein the electrical line overcomes a difference in height of at most 50 µm in a direction perpendicular to the mounting region along its entire path from the connection region to the semiconductor chip,
wherein the chip top side terminates flush with the cast body in a direction pointing away from the mounting region so that the fluorescent body projects beyond the cast body, and
wherein the semiconductor device is free of electrical through-connections.

3. The optoelectronic semiconductor device according to claim 1, wherein the semiconductor chip is a light emitting diode chip configured to generate radiation, wherein the mounting region is located in a passage of the respective lead frame part, and wherein the passage forms a reflector for the radiation.

4. The optoelectronic semiconductor device according to claim 3, wherein a wall of the respective lead frame part is formed around the passage, and wherein the wall has a recess in the region of the electrical line so that a distance between the electrical line and the respective lead frame part is increased due to the recess.

5. The optoelectronic semiconductor device according to claim 1, further comprising a fluorescent body arranged on the chip top side, wherein the fluorescent body terminates flush with the cast body in a direction pointing away from the mounting region, and wherein the fluorescent body has an electrical through-connection which extends from the electrical line to the chip top side.

6. The optoelectronic semiconductor device according to claim 1, further comprising a fluorescent body arranged on the chip top side, wherein the chip top side terminates flush with the cast body in a direction pointing away from the mounting region so that the fluorescent body projects beyond the cast body, and wherein the semiconductor device is free of electrical through-connections.

7. The optoelectronic semiconductor device according to claim 1, wherein the reduced thickness is between 20% and 55% inclusive of the full thickness, wherein the full thickness is between 70 µm and 0.5 mm inclusive, and wherein a minimum distance between the lead frame parts is between 0.05 mm and 0.5 mm inclusive.

8. The optoelectronic semiconductor device according to claim 1, wherein a top side of the cast body facing away from the mounting region is curved when viewed in cross-section and rises steadily from the chip top side to the connection region.

9. The optoelectronic semiconductor device according to claim 1, wherein the semiconductor chip projects laterally beyond the lead frame part with the mounting region, wherein the following applies to a lateral projection P of the semiconductor chip over this lead frame part as a function of the full thickness D2 and the reduced thickness D1: $0.4*(D2-D1) \leq P \leq 1.5*(D2-D1)$, and wherein, with regard to a mean edge length E of the chip top side, $P \leq 0.4*E$.

10. The optoelectronic semiconductor device according to claim 1, wherein the cast body is transmissive for light and/or wherein the lead frame parts are coated with a reflective coating.

11. The optoelectronic semiconductor device according to claim 1, wherein the optoelectronic semiconductor device comprises at least two different types of semiconductor chips, and wherein the semiconductor chips are electrically controllable independently of each other.

12. A method for producing optoelectronic semiconductor devices according to claim 1, the method comprising:
providing a semi-etched lead frame composite comprising a plurality of lead frames, wherein each lead frame comprises a plurality of lead frame parts;
placing the semiconductor chips on the lead frames;
forming the cast body;
forming electrical lines and electrical wirings between the lead frames, the wirings electrically connecting platforms of adjacent lead frames; and
separating connecting bridges between the lead frames so that an electrical connection between adjacent lead frames is only provided via the wirings.

13. The method according to claim 12, further comprising:
testing the semiconductor chips; and
separating the semiconductor devices by cutting the cast body and the wiring.

14. The method according to claim 13, wherein the electrical lines together with the wirings are the only electrical connections in the lead frame composite while testing the semiconductor chips, and wherein the platforms have the full thickness and are without function in the finished semiconductor devices.

15. The method according to claim 12, wherein a width of the electrical lines and the wirings each are between 20 µm and 150 µm inclusive and a thickness of the electrical lines and the wirings each are between 2 µm and 20 µm inclusive, and wherein the lines and the wirings are produced simultaneously.

16. The method according to claim 12, wherein forming the cast body comprises film assisted molding so that the connection regions and the chip top sides are covered with a spraying film when a material of the cast body is filled in, and wherein the spraying film compensates for height differences between the connection regions and the chip top sides.

17. An optoelectronic semiconductor device comprising:
at least two lead frame parts;
at least one optoelectronic semiconductor chip arranged on a mounting region on one of the lead frame parts;
a white, reflective cast body mechanically connecting the lead frame parts to one another and in which the semiconductor chip is embedded; and
at least one electrical line,
wherein the semiconductor chip comprises a chip top side facing away from the mounting region,
wherein side surfaces of the semiconductor chip are covered with a transparent encapsulation directly adjoining the reflective cast body,
wherein the respective lead frame part has a reduced thickness in the mounting region, wherein the electrical line is arranged across the cast body and is directly arranged on the cast body and on the transparent encapsulation from the semiconductor chip to a connection region of the other of the lead frame parts, wherein the other lead frame part has a full thickness in the connection region, and wherein the electrical line overcomes a difference in height of at most 50 μm in a direction perpendicular to the mounting region along its entire path from the connection region to the semiconductor chip.

18. The optoelectronic semiconductor device according to claim 2, wherein the connection region is higher than the chip top side, and wherein a difference in height along the entire path is not more than 20 μm.

* * * * *